US009698221B2

(12) United States Patent
Sugawara et al.

(10) Patent No.: US 9,698,221 B2
(45) Date of Patent: Jul. 4, 2017

(54) SEMICONDUCTOR DEVICE

(71) Applicant: Mitsubishi Electric Corporation, Chiyoda-ku (JP)

(72) Inventors: Katsutoshi Sugawara, Tokyo (JP); Yasuhiro Kagawa, Tokyo (JP); Rina Tanaka, Tokyo (JP); Yutaka Fukui, Tokyo (JP)

(73) Assignee: Mitsubishi Electric Corporation, Chiyoda-ku (JP)

(*) Notice: Subject to any disclaimer, the term of this patent is extended or adjusted under 35 U.S.C. 154(b) by 0 days.

(21) Appl. No.: 15/307,668

(22) PCT Filed: Mar. 30, 2015

(86) PCT No.: PCT/JP2015/059968
§ 371 (c)(1),
(2) Date: Oct. 28, 2016

(87) PCT Pub. No.: WO2015/166754
PCT Pub. Date: Nov. 5, 2015

(65) Prior Publication Data
US 2017/0053984 A1 Feb. 23, 2017

(30) Foreign Application Priority Data
May 1, 2014 (JP) .................. 2014-094383

(51) Int. Cl.
*H01L 29/66* (2006.01)
*H01L 29/06* (2006.01)
(Continued)

(52) U.S. Cl.
CPC ...... *H01L 29/0696* (2013.01); *H01L 29/0865* (2013.01); *H01L 29/1608* (2013.01);
(Continued)

(58) Field of Classification Search
None
See application file for complete search history.

(56) References Cited

U.S. PATENT DOCUMENTS 7,470,953 B2   12/2008   Takaya et al.
8,350,322 B2   1/2013   Matsuoka
(Continued)

FOREIGN PATENT DOCUMENTS

JP   2000-323707 A   11/2000
JP   2005-116822 A   4/2005
(Continued)

OTHER PUBLICATIONS

International Preliminary Report on Patentability and Written Opinion issued Nov. 10, 2016 in PCT/JP2015/059968 (with English language translation).
(Continued)

*Primary Examiner* — Reema Patel
(74) *Attorney, Agent, or Firm* — Oblon, McClelland, Maier & Neustadt, L.L.P.

(57) ABSTRACT

It is an object to provide the techniques capable of restraining avalanche breakdown at cells opposite to a corner portion of a gate pad. A MOSFET is provided with a corner cell, which is disposed in a region opposite to a corner portion of a gate pad in a planar view, and an internal cell, which is disposed in a region in the opposite side of the gate pad with respect to the corner cell. In a contour shape of the corner cell, a longest distance among distances each of which is shortest distance between a longest side and each of sides opposite to the longest side is equal to or less than two times of a length of one of equal sides or a short side of the internal cell.

18 Claims, 11 Drawing Sheets

(51) Int. Cl.
*H01L 29/423* (2006.01)
*H01L 29/08* (2006.01)
*H01L 29/417* (2006.01)
*H01L 29/739* (2006.01)
*H01L 29/78* (2006.01)
*H01L 29/16* (2006.01)

(52) U.S. Cl.
CPC .... *H01L 29/41741* (2013.01); *H01L 29/4236* (2013.01); *H01L 29/7397* (2013.01); *H01L 29/7813* (2013.01)

(56) References Cited

U.S. PATENT DOCUMENTS

2005/0286194 A1  12/2005  Fujiki et al.
2010/0258863 A1  10/2010  Kaneko

FOREIGN PATENT DOCUMENTS

| | | |
|---|---|---|
| JP | 2005-322949 A | 11/2005 |
| JP | 2006-12960 A | 1/2006 |
| JP | 2007-173411 A | 7/2007 |
| JP | 2009-4655 A | 1/2009 |
| JP | 2010-251422 A | 11/2010 |
| JP | 2011-29675 A | 2/2011 |
| JP | 2011-100877 A | 5/2011 |

OTHER PUBLICATIONS

Japanese Office Action Issued Apr. 12, 2016 in Japanese Application No. 2016-500421 (with partial English translation).
International Search Report Issued Jun. 9, 2015 in PCT/JP15/059968 Filed Mar. 30, 2015.

F I G. 1 8
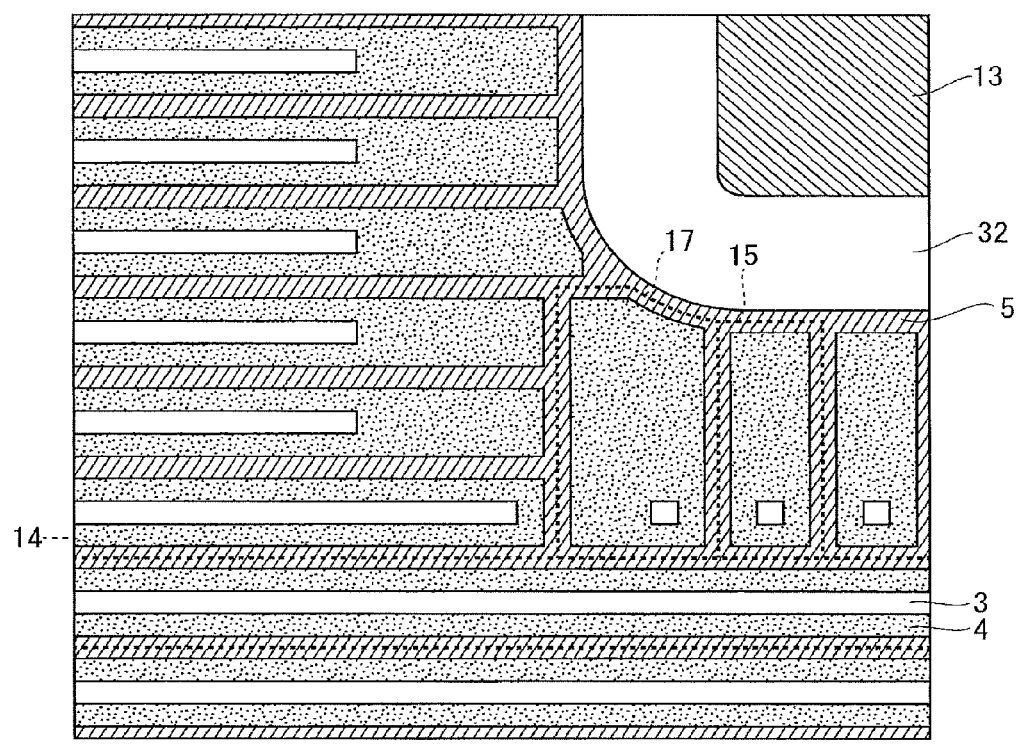

SEMICONDUCTOR DEVICE

TECHNICAL FIELD

The present invention relates to semiconductor devices of a trench gate type.

BACKGROUND ART

As switching elements which control electric power supply to loads such as motors, insulating-gate-type semiconductor devices such as Insulated Gate Bipolar Transistors (IGBTs) and Metal Oxide Semiconductor Field Effect Transistors (MOSFETs) are widely used in power electronics devices. One of vertical MOSFETs for electric power control is a trench-gate-type MOSFET in which a gate electrode is formed to be buried in a semiconductor layer (for example, Patent Documents 1, 2 described below). The MOSFET for electric power control requires a low resistance in an on-operation and a high withstand voltage in an off-operation. However, generally, in a trench-gate-type MOSFET, withstand-voltage increase and on-resistance reduction are in a trade-off relation.

On the other hand, as next-generation switching elements capable of realizing a high withstand voltage and a low loss, MOSFETs, IGBTs, etc. using a wide-band-gap semiconductor such as silicon carbide (SiC) are attracting attention and are highly expected to be applied to the technical field in which high voltages of about 1 kV or more are used. Examples of the wide-band-gap semiconductor include gallium-nitride (GaN)-based materials, diamonds, etc. other than SiC.

In some of the vertical MOSFETs for electric power control, a plurality of unit MOSFETs are connected in parallel and used as one MOSFET. MOSFETs can be sorted by the disposition patterns of the individual unit MOSFETs constituting them. Examples of typical ones include a cell type which include one unit MOSFET (cell) having a source region formed in a square-shaped pattern and having a gate trench surrounding therearound, and the examples of the typical ones include a stripe type which has source regions formed in long-and-narrow stripe-shaped patterns and has a gate trench disposed between the two patterns.

In a MOSFET region including a plurality of unit MOSFETs (cells), in an outer peripheral portion of the MOSFET region, the state of electric fields is different from that in the interior of the MOSFET region. Therefore, in a configuration in which the cells having the same structures as those in the interior of the MOSFET region are disposed in the outer peripheral portion of the MOSFET, avalanche breakdown sometimes occurs in the outer peripheral portion. Since the withstand voltage as the whole MOSFET is determined by the lowest withstand voltage among the withstand voltages of the individual cells, the cells disposed in the outer peripheral portion in which the state of electric fields is different are also required to have the withstand voltages equivalent to those of the cells in the interior. Therefore, in order to increase the withstand voltage, it has been proposed to cause the cells disposed in the outer peripheral portion to have the structures or dimensions different from those of the cells disposed in the interior.

For example, Patent Document 1 discloses a technique of restraining generation of high electric fields in the outer peripheral portion by extending the trenches of the cells disposed in the outer peripheral portion so that they reach an electric-field diminishing portion. Patent Document 2 discloses a technique of forming a structure dedicated for diminishing electric fields in the outer peripheral portion, wherein, for example, gate trenches are eliminated from all the cells disposed in the outer peripheral portion According to these techniques, the withstand voltages in the outer-peripheral-portion cells at which avalanche breakdown easily occurs can be improved, and the withstand voltage as the whole MOSFET can be improved.

PRIOR ART DOCUMENTS

Patent Documents

Patent Document 1: Japanese Patent Application Laid-Open No. 2005-322949
Patent Document 2: Japanese Patent Application Laid-Open No. 2011-100877

SUMMARY OF INVENTION

Problems to be Solved by the Invention

The wirings for extending a gate electrode and a source electrode of a MOSFET are connected to a gate pad and a source pad, respectively. Corner portions of the gate pad and the source pad are sometimes formed in curved shapes in order to avoid the concentration of electric fields. According to analysis by the inventors, there is a tendency that avalanche breakdown frequently occurs in the cells formed in the regions opposite to the corner portion (curved portion) of the gate pad among the cells of the outer peripheral portion.

On the other hand, Patent Documents 1 and 2 disclose the techniques about the cells of the outer peripheral portion, but do not disclose about restraint of the avalanche breakdown at the cells at which avalanche breakdown frequently occurs, in other words, at the cells opposite to the corner portion (curved portion) of the gate pad.

Therefore, the present invention has been accomplished in view of the above described problematic points, and it is an object of the present invention to provide the techniques capable of restraining the avalanche breakdown at the cells opposite to the corner portion of the gate pad.

Means for Solving the Problems

A semiconductor device according to the present invention is provided with: a gate pad; a first cell disposed in a region opposite to a corner portion of the gate pad in a planar view; and a second cell disposed in a region in an opposite side of the gate pad with respect to the first cell in the planar view. Each of the first and second cells is provided with: a semiconductor layer of a first conductivity type; a base region of a second conductivity type formed in an upper portion of the semiconductor layer; a gate electrode disposed via a gate insulating film in a trench penetrating the base region and reaching the semiconductor layer below the base region, the gate electrode having a pattern corresponding to a contour shape of the first and second cell in the planar view, and the gate electrode electrically connected to the gate pad; and a protective diffusion layer of the second conductivity type formed in a bottom portion of the trench. At least the second cell among the first and second cells is further provided with: a source region of the first conductivity type formed in a part adjacent to the gate insulating film in an upper portion of the base region and a source electrode electrically connected to the base region and the source region. The contour shape of each of the first and second cells is a polygonal shape of a four-or-more sided polygon; in the contour shape of the first cell, a longest distance among distances each of which is shortest distance between a longest side and each of sides opposite to the longest side is equal to or less than two times of a length of one of equal sides or a short side of the second cell; and, the polygonal shape of the first cell has more vertices than vertices of the polygonal shape of the second cell.

Effects of the Invention

According to the present invention, the first cell, which is disposed in the region opposite to the corner portion of the gate pad in the planar view, and the second cell, which is disposed in the region in the opposite side of the gate pad with respect to the first cell, are provided. In the contour shape of the first cell, the longest distance among distances each of which is shortest distance between the longest side and each of the sides opposite to the longest side is equal to or less than two times of the length of one of the equal sides or the short side of the second cell. Therefore, avalanche breakdown at the first cell opposite to the corner portion of the gate pad can be restrained.

Objects, characteristics, aspects, and advantages of the present invention will be more elucidated by below detailed descriptions and accompanying drawings.

BRIEF DESCRIPTION OF DRAWINGS

FIG. 18 is a plan view showing a configuration of a MOSFET according to a modification example of the first embodiment;

DESCRIPTION OF EMBODIMENTS

Figure 1:
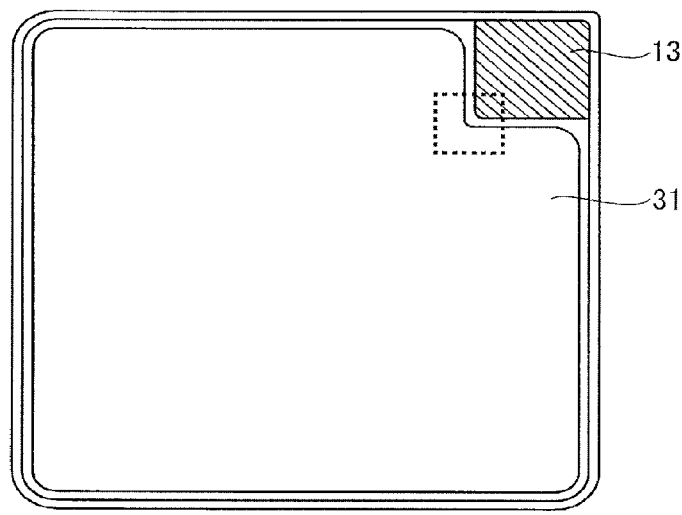
FIG. 1 is a plan view showing a configuration of a MOSFET according to a first embodiment.

Hereinafter, embodiments of semiconductor devices according to the present invention will be described in detail based on drawings. The present invention is not limited to following descriptions, and modifications can be arbitrarily made within the range not departing from the gist of the present invention. In the drawings shown below, scale sizes of members are different from actual scale sizes in some cases in order to facilitate understanding. The same applies among drawings too.

First Embodiment

<Configuration>

Hereinafter, a semiconductor device according to the present first embodiment is a silicon-carbide (SiC) semiconductor device and will be described by taking a case of a trench-gate-type MOSFET as an example. FIG. 1 is a plan view showing an overall configuration of a MOSFET according to the present first embodiment.

The MOSFET of FIG. 1 is provided with a gate pad 13 and a cell region 31 and approximately has a rectangular shape as a whole. When the contour shape of the MOSFET is a rectangular shape like this, formation into chips by dicing can be facilitated, and the area occupied by the gate pad 13 in the whole MOSFET can be reduced.

The contour shape of the cell region 31 is corresponding to the contour shape of a source pad. As shown in FIG. 1, corner portions of the contour shapes of the gate pad 13 and the source pad (cell region 31) are formed into curved shapes in order to avoid electric-field concentration. The corner portions of the gate pad 13 and the source pad are sharp in a macroscopic view, but are rounded curved portions in a microscopic view.

Figure 2:
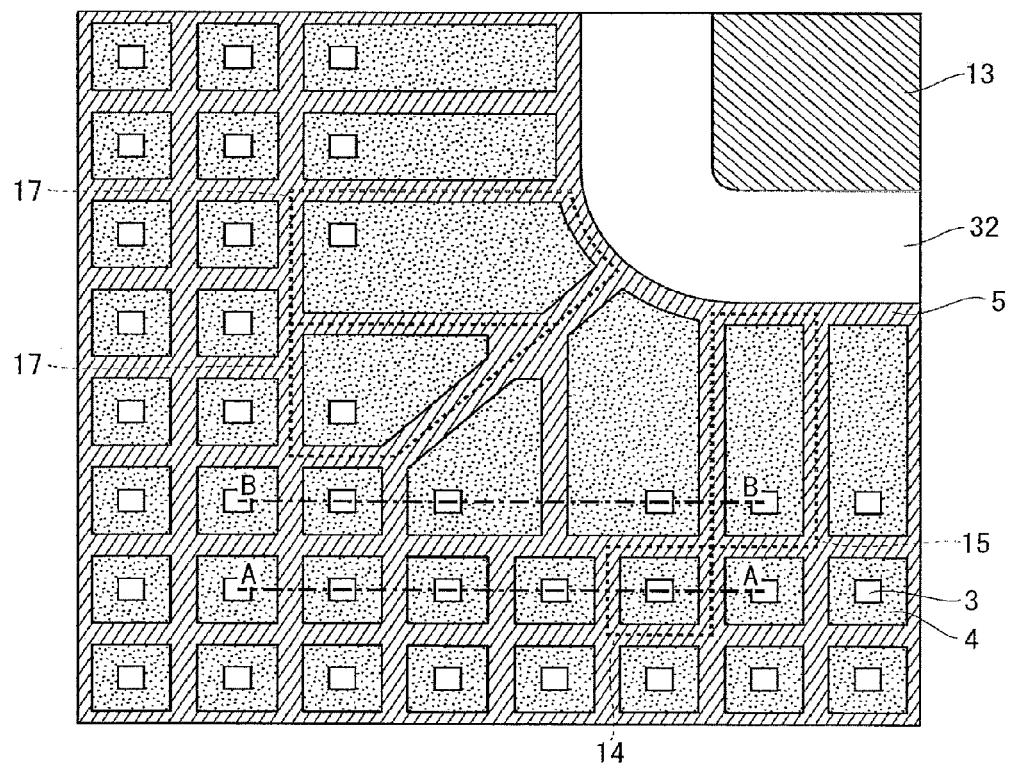
FIG. 2 is a plan view showing the configuration of the MOSFET according to the first embodiment.

FIG. 2 is a plan view showing part of the configuration of the MOSFET according to the present first embodiment and is specifically a plan view in which the region surrounded by a broken line in FIG. 1 is enlarged. In the cell region 31 of FIG. 1, a plurality of cells (cells 14, 15, 17) shown by broken lines of FIG. 2 are disposed.

The cell 15 is a cell (hereinafter, referred to as "outer-peripheral-portion cell 15") disposed in a region of an outer peripheral portion not opposite to the gate pad 13 and in a region opposite to a side portion (linear part) of the gate pad 13 in the cell region 31 in a planar view. Herein, the contour shape of the outer-peripheral-portion cell 15 in the planar view is a rectangular shape. When the dimensions of the outer-peripheral-portion cell 15 are larger than the dimensions of the cell 14, the electric field applied to the outer-peripheral-portion cell 15 can be diminished.

The cells 17 (first cells) are the cells (hereinafter, described as "corner cells 17") disposed in a region (inner corner portion) opposite to a corner portion (curved portion) of the gate pad 13 in the cell region 31 in the planar view. Herein, the contour shapes of the corner cells 17 in the planar view are two types of pentagonal shapes (polygonal shapes of four-or-more sided polygons). All of the interior angles of the pentagonal shapes of the corner cells 17 are 90° or more.

Figure 3:
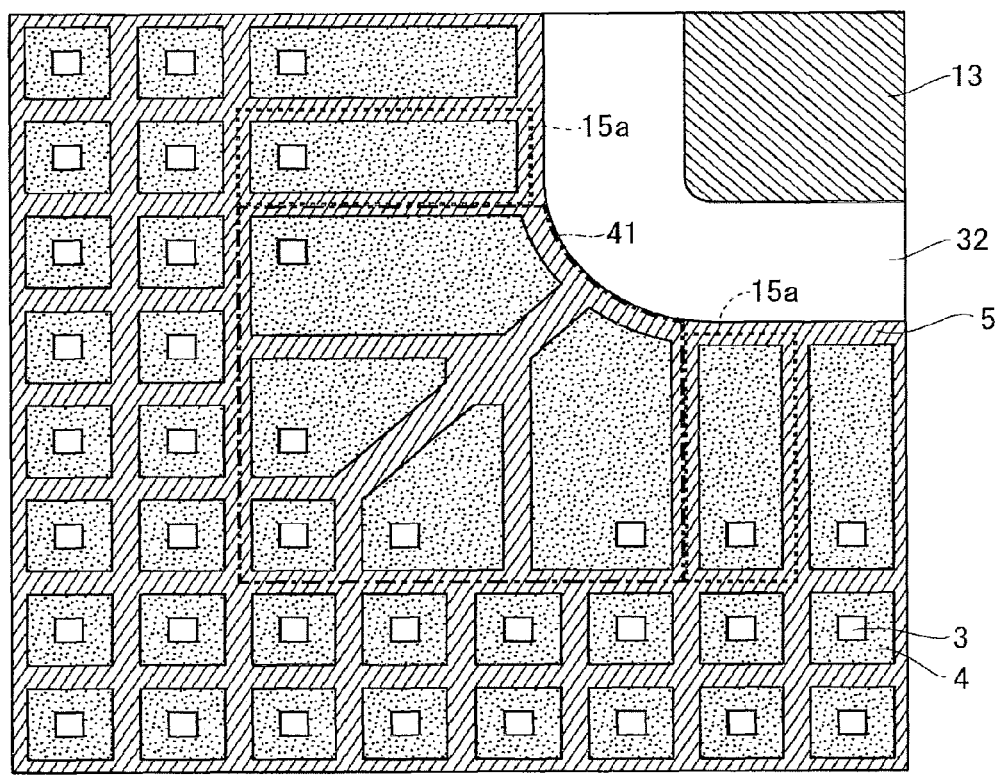
FIG. 3 is a plan view showing the configuration of the MOSFET according to the first embodiment.

FIG. 3 is a view showing a region 41 which includes the corner cells 17 disposed therein and is opposite to a corner portion of the gate pad 13. The region 41 opposite to the corner portion of the gate pad 13 corresponds to a region surrounded by a one-dot chain line in FIG. 3. In the present first embodiment, the cell region 31 overlapped with the region of the gate pad 13 when the region of the gate pad 13 is rotated about one corner portion of the gate pad 13 by 180 degrees in the planar view is defined as a first region. The region of a square or a rectangle which uses, as a diagonal line, the line mutually connecting end portions in the opposite side of the gate pad 13 among the end portions of two external cells 15$a$, which are adjacent to the gate pad 13 and the first region is defined as a second region. The region overlapped with the first region and the second region is defined as the region 41 opposite to the corner portion of the gate pad 13 according to the present first embodiment.

Returning to FIG. 2, the cells 14 (second cells) are the cells (hereinafter, described as "internal cells 14") which are disposed in internal regions such as the regions in the opposite side of the gate pad 13 with respect to the outer-peripheral-portion cell 15 or the corner cell 17 in the cell region 31 in the planar view. The internal cells 14 occupy many of the cells disposed in the cell region 31. Herein, the contour shapes of the internal cells 14 in the planar view are regular tetragonal shapes (polygonal shapes of four-or-more sided polygons). Herein, the contour shapes of the internal cells 14 in the planar view may be rectangles or squares. The polygonal shape of the corner cell 17 has more vertices than the vertices of the polygonal shape of the internal cell 14.

Figure 4:
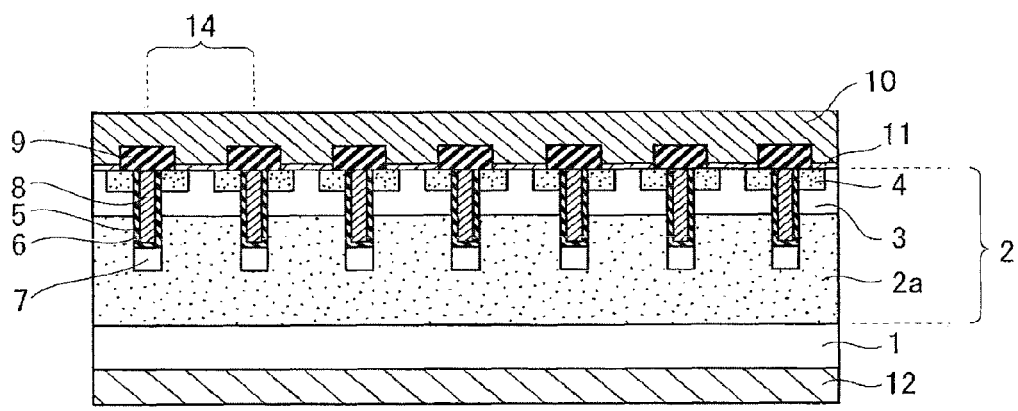
FIG. 4 is a cross-sectional view showing the configuration of the MOSFET according to the first embodiment.
Figure 5:
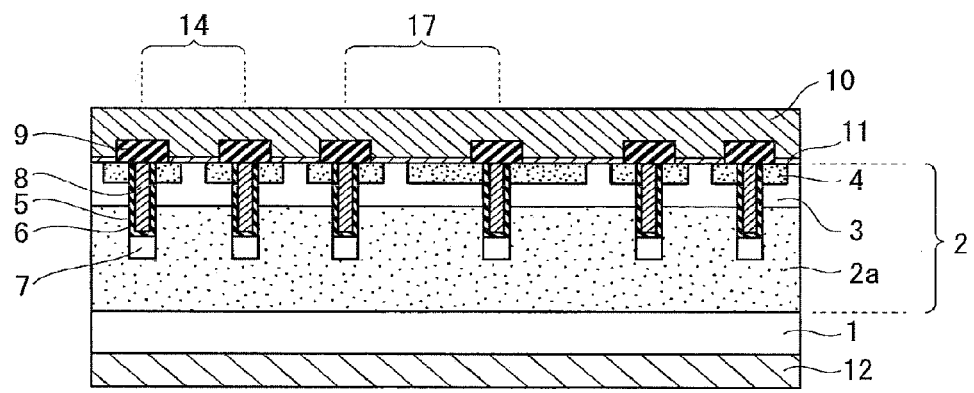
FIG. 5 is a cross-sectional view showing the configuration of the MOSFET according to the first embodiment.

FIG. 4 and FIG. 5 are cross-sectional views showing part of the configuration of the MOSFET according to the present first embodiment. Specifically, FIG. 4 is a cross-sectional view along line A-A of FIG. 2 and is showing a cross-sectional configuration of the internal cells 14. FIG. 5 is a cross-sectional view along line B-B of FIG. 2 and is showing a cross-sectional configuration of the internal cells 14 and the corner cells 17.

In the present first embodiment, the internal cells 14 and the corner cells 17 are provided with: an n-type SiC substrate 1, an n-type (first conductivity type) epitaxial layer (semiconductor layer) 2, a p-type (second conductivity type) base region 3, n-type source regions 4, a gate insulating film 6, a protective diffusion layer 7, gate electrodes 8, an interlayer insulating film 9, a source electrode 10, ohmic electrodes 11, and a drain electrode 12. Each one of the internal cells 14 and the corner cells 17 independently has the function of a MOSFET (switching element). It is assumed that each of the outer-peripheral-portion cells 15 is formed like the internal cells 14 and the corner cells 17 and independently has the function of a MOSFET.

Next, the configuration of the internal cell 14 and the corner cell 17 will be described in detail.

The epitaxial layer 2 is formed by epitaxial growth of a SiC layer on the SiC substrate 1. For example, an epitaxial substrate having the epitaxial layer 2 grown on the SiC substrate 1 in advance is applied to the SiC substrate 1 and the epitaxial layer 2.

The base region 3 has a conductivity type opposite to that of the epitaxial layer 2 and is formed on an upper portion (upper surface) of the epitaxial layer 2. The remaining epitaxial layer 2 in which the base region 3 is not formed serves as a drift layer 2$a$. Trenches (gate trenches) 5 are formed in the epitaxial layer 2 and the base region 3. The trenches 5 are penetrating the base region 3, and bottom portions of the trenches 5 reach the drift layer 2$a$ (the epitaxial layer 2 below the base region 3).

The gate insulating film 6 is provided on an inner surface (bottom surface and lateral surface) of the trench 5, and the gate electrode 8 is disposed in the trench 5 via the gate insulating film 6. As shown in FIG. 2, the trenches 5 have a pattern (approximately grid-like pattern) corresponding to the contour shapes of the internal cells 14, the outer-peripheral-portion cells 15, and the corner cells 17. FIG. 2 omits illustration of the gate insulating film 6 and the gate electrodes 8 (therefore, the interlayer insulating film 9 and the source electrode 10 described later) from a viewpoint of simplification of the view. However, the gate electrodes 8 disposed in the trenches 5 also have a pattern (approximately grid-like pattern) corresponding to the contour shapes of the internal cells 14, the outer-peripheral-portion cells 15, and the corner cells 17 in the planar view as well as the trenches 5.

In a below-gate-pad well 32 disposed between the gate pad 13 and the cell region 31 shown in FIG. 2, a silicon oxide film, gate wiring (polycrystalline silicon), and a silicon film, all of which are not shown, are sequentially disposed on the SiC substrate 1. Contact holes are provided in lower portions of the gate insulating film 6 adjacent to the below-gate-pad well 32, and the gate electrodes 8 are electrically connected to the gate pad 13 via the contact holes and the gate wiring.

As shown in FIG. 4 and FIG. 5, the protective diffusion layer 7 is formed in the drift layer 2$a$ adjacent to bottom portions of the trenches 5, in other words, lower portions of the trenches 5. The protective diffusion layer 7 also has an approximately grid-like pattern in the planar view like the gate electrode 8. The protective diffusion layer 7 has functions to facilitate depletion of the drift layer 2$a$ when the MOSFET is turned off, diminish the concentration of electric fields to the bottom portions of the trenches 5, and restrain breakdown of the gate insulating film 6.

The source regions 4 are formed in the parts adjacent to the gate insulating film 6 in an upper portion of the base region 3.

The interlayer insulating film 9 is disposed in the parts in the source region 4 close to the gate insulating film 6 and is disposed above the gate insulating film 6 and the gate electrodes 8 so as to cover them. The interlayer insulating film 9 is provided with contact holes which reach the parts in the source region 4 distant from the gate insulating film 6 and reach the base region 3, and the low-resistance ohmic electrodes 11 are disposed in the contact holes.

The source electrode 10 constituting a source pad is disposed on the interlayer insulating film 9 and is electrically connected to the source regions 4 and the base region 3 via the ohmic electrodes 11. The drain electrode 12 is disposed on a lower surface of the SiC substrate 1.

Herein, in the present first embodiment, in the contour shape of the corner cell 17 in the planar view, among distances each of which is shortest distance between a longest side and each of sides opposite to the side, a longest distance is configured to be, for example, equal or less than two times of one of equal sides of the internal cell 14. Next, in order to describe effects of the MOSFET according to the present first embodiment configured in the above manner, a related MOSFET (hereinafter, described as "related MOSFET") will be described.

<Related MOSFET>

Figure 6:
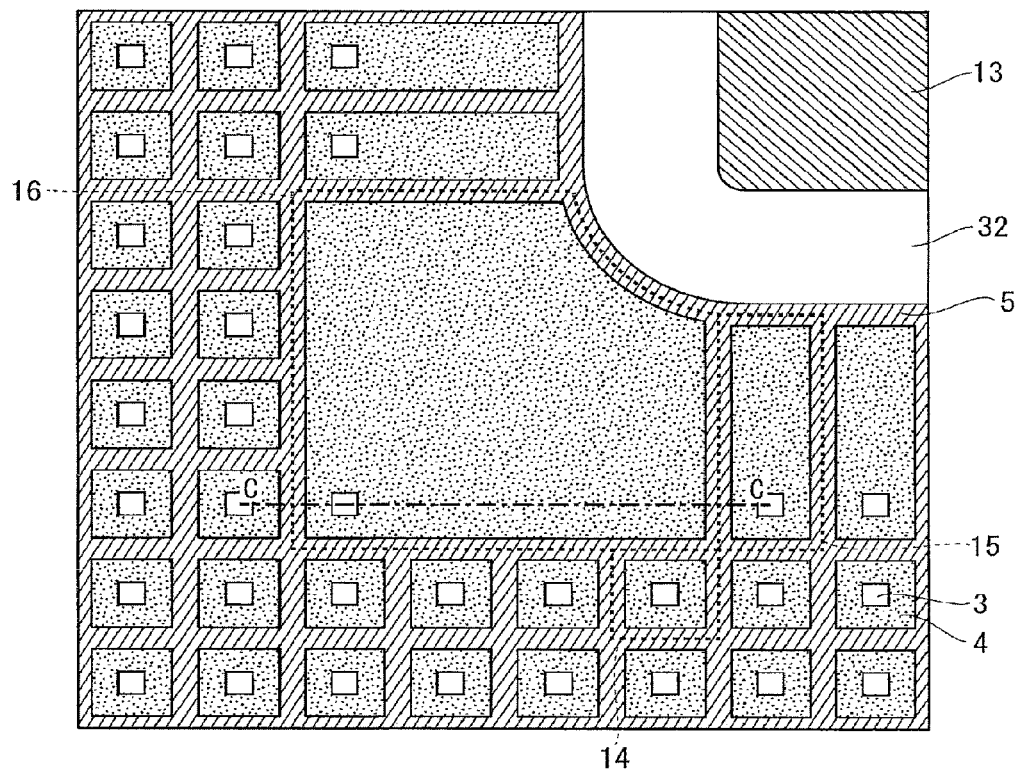
FIG. 6 is a plan view showing a configuration of part of a related MOSFET.

FIG. 6 is a plan view showing a configuration of part of the related MOSFET as well as FIG. 2. Hereinafter, in the related MOSFET, the constituent elements same as the constituent element described above are denoted by the same reference signs, and the constituent elements in the related MOSFET, which are different from the above described constituent elements and problematic points will be described.

As shown in FIG. 6, the related MOSFET is provided with one related corner cell 16 instead of the above described corner cells 17. Herein, the contour shape of the related corner cell 16 in a planar view has a side longer than a long side of the outer-peripheral-portion cell 15.

As well as the MOSFET according to the first embodiment, also in the related MOSFET, in order to diminish the electric fields applied to the outer-peripheral-portion cells 15, the dimensions of the outer-peripheral-portion cells 15 and the dimensions of the internal cells 14 are different from each other; and, in order to diminish electric-field concentration, corner portions of the contour shapes of the gate pad 13, etc. are provided with certain curvatures.

When analysis is carried out for the related MOSFET as described above, the inventors found out a tendency that avalanche breakdown occur frequently at the related corner cell 16. Therefore, the inventors conceived that the reason that avalanche breakdown occurs at the related corner cell 16 is different from the reason that avalanche breakdown occurs at the terminal-region-side cell of the whole MOSFET of FIG. 1 (for example, the outer-peripheral-portion cell 15 disposed at a different corner or side portion of the cell region 31). In consideration of that, the inventors considered the cause of occurrence of avalanche breakdown at the related corner cell 16 as following.

Figure 7:
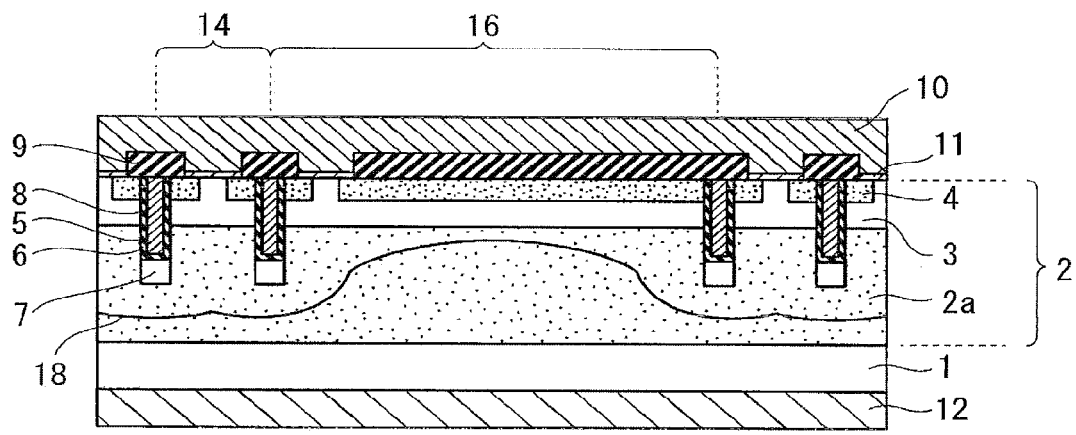
FIG. 7 is a cross-sectional view showing the configuration of part of the related MOSFET.

FIG. 7 is a cross-sectional view showing part of the configuration of the related MOSFET and is specifically a cross-sectional view along line C-C of FIG. 6. FIG. 7 shows a depletion-layer end 18, which is expected in the related MOSFET.

In the related MOSFET having the configuration as described above, the dimensions and shape of the related corner cell 16 are largely different from those of the internal cell 14, and the distance between two opposite sides of the contour shape of the related corner cell 16 is comparatively large. Therefore, as shown in FIG. 7, the depletion-layer end 18 is close to the base region 3 in a central portion of the related corner cell 16. It is conceived that the electric-field intensity at the central portion of the related corner cell 16 is increased along with this and facilitates occurrence of avalanche breakdown. In a terminal region of the cell region 31, electric fields are restrained by the effects of a terminal structure. However, in an inner corner portion distant from the terminal region, the state of electric fields is unique, and it is conceived that this also somewhat affects the fact that avalanche breakdown easily occurs at the related corner cell 16.

Figure 8:
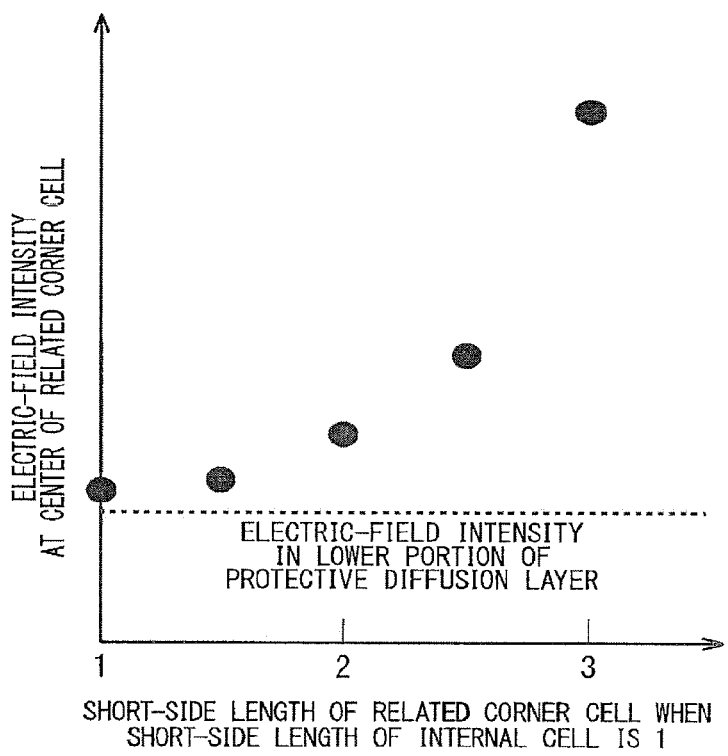
FIG. 8 is a diagram showing relations between cell dimension ratios and electric-field intensity.

In consideration of these, the inventors researched the relation between the ratio of the length of a short side of the related corner cell 16 to one of the equal sides of the internal cell 14 and the electric-field intensity at the central portion of the related corner cell 16. FIG. 8 is a view showing results thereof. As shown in FIG. 8, in a range in which a cell dimension ratio is small (range of, for example, 2 or less), the relation between the cell dimension ratio and the electric-field intensity is not linear. This is conceivably for a reason that a depletion layer extending from the trench 5 and from the protective diffusion layer 7 reaches the central portion of the related corner cell 16. Reversely, in the related MOSFET in which the dimensions and shape are large, the depletion layer extending from the trench 5 and from the protective diffusion layer 7 has a small depletion-layer thickness so that the depletion layer does not reach the central portion of the related corner cell 16, and it is conceivable that, as a result thereof, avalanche breakdown frequently occur at the related corner cell 16.

<Dimensions of MOSFET According to First Embodiment>

Therefore, the inventors thought of restraining reduction of the depletion-layer thickness at the cell central portion disposed in the region 41 opposite to the curved portion of the gate pad 13 in the planar view by utilizing this.

Specifically, in the contour shape of the corner cell 17 in the planar view shown in FIG. 2, the longest distance among the distances each of which is shortest distance between the longest side and each of the sides opposite to the longest side is shortened. Herein, in consideration of the relation of FIG. 8, if the contour shape of the internal cell 14 is a regular tetragon, the distance to be appropriately shortened is caused to be equal to or less than two times of the length of one of the equal sides of the internal cell 14; and, if the contour shape of the internal cell 14 is a rectangle or the like, the distance to be appropriately shortened is equal to or less than two times of the length of the short side of the internal cell 14. In FIG. 2, as an example thereof, the distance to be appropriately shortened in the corner cell 17 is 1.5 times the length of one of the equal sides of the internal cell 14.

According to the configuration as described above, reduction of the depletion-layer thickness at the central portion of the corner cell 17 can be restrained by the depletion layer extending from the long-side trench 5 and the protective diffusion layer 7.

Figure 9:
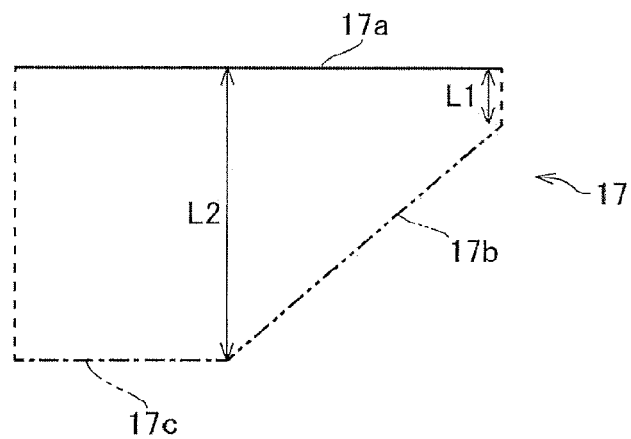
FIG. 9 is a plan view showing the configuration of the MOSFET according to the first embodiment.

Herein, the distance to be appropriately shortened in the corner cell 17 will be described in detail. FIG. 9 is a view for describing the distance to be shortened in one of the corner cells 17 shown in FIG. 2. In FIG. 9, a long side 17a of the corner cell 17 is shown by a solid line, sides 17b and 17c opposite to the long side 17a are shown by a two-dot chain line and a one-dot chain line, respectively.

The shortest distance between the long side 17a and the opposite side 17b (the shortest distance among the distances between arbitrary points on the long side 17a and arbitrary points on the side 17b) is L1. The shortest distance between the long side 17a and the opposite side 17c (the shortest distance among the distances between arbitrary points on the long side 17a and arbitrary points on the side 17c) is L2. Among the shortest distances (L1, L2), the longest distance is L2. Therefore, in the corner cell 17 shown in FIG. 9, the distance to be appropriately shortened is L2.

<Manufacturing Method>

Next, a manufacturing method of the MOSFET according to the present first embodiment will be described. FIG. 10 to FIG. 16 are views showing processes of the manufacturing method and is specifically a cross-sectional view along line B-B of FIG. 2 as well as FIG. 5.

Figure 10:
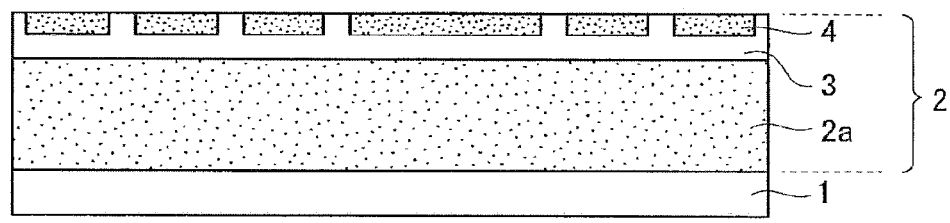
FIG. 10 is a cross-sectional view showing a manufacturing method of the MOSFET according to the first embodiment.

First, as shown in FIG. 10, the epitaxial layer (semiconductor layer) 2 is formed on the SiC substrate 1. Herein, as an example, the n-type low-resistance SiC substrate 1 having a polytype of 4H is prepared, and the n-type epitaxial layer 2 is epitaxially grown thereon by a chemical vapor deposition (CVD) method. The epitaxial layer 2 is formed so that the drift layer 2a which is finally formed is ensured to have an impurity concentration of $1\times10^{14}$ cm$^{-3}$ to $1\times10^{17}$ cm$^{-3}$ and a thickness of 5 to 200 μm.

Then, the base region 3 and the source regions 4 are formed by ion-implanting a dopant, which is determined in advance, into the surface of the epitaxial layer 2. As a result, the structure shown in FIG. 10 is obtained.

The base region 3 is formed by ion implantation of aluminum (Al), which is a p-type impurity. The depth of the ion implantation of Al is a depth (for example, about 0.5 to 3 μm) which does not exceed the thickness of the epitaxial layer 2. The impurity concentration of the implanted Al is caused to be higher than the n-type impurity concentration of the epitaxial layer 2. The region of the epitaxial layer 2 deeper than the implantation depth of Al in this process remains as the n-type drift layer 2a.

The base region 3 may be formed by p-type epitaxial growth. Also in that case, the impurity concentration and the thickness of the base region 3 is caused to be equivalent to those of the case in which it is formed by ion implantation.

The source regions 4 are formed by selectively ion-implanting nitrogen (N) into the surface of the base region 3. The contour shapes of the source regions 4 in the planar view are formed in the pattern along the layout of the gate electrodes 8 (trenches 5) formed in a process thereafter (see FIG. 2). As a result, when the gate electrodes 8 are formed, the source regions 4 are disposed in both sides of the gate electrodes 8. The depth of the ion implantation of N in this process is caused to be shallower than the thickness of the base region 3. The impurity concentration of implanted N is caused to be higher than the p-type impurity concentration of the base region 3 and is, for example, in the range of $1\times10^{18}$ cm$^{-3}$ to $1\times10^{21}$ cm$^{-3}$.

The sequence of ion implantation of forming the above described impurity regions is not required to be the above described sequence as long as the structure of FIG. 5 can be finally obtained. A depletion restraining layer (not shown) formed by ion-implanting nitrogen (N) or phosphorous (P), which is an n-type impurity, may be provided in a lower portion of the base region 3. In the structure of FIG. 4 and FIG. 5 in which the depletion restraining layer is not provided, a so-called JFET resistance which absorbs a current path by the depletion layer extending from both of the base region 3 and the protective diffusion layer 7 is generated therebetween. On the other hand, in the configuration in which the above described depletion restraining layer is provided, extension of the depletion layer from the base region 3, etc. in a case of on is restrained, and, therefore, the JFET resistance can be reduced. The depth of the depletion restraining layer is desired to be deeper than the base region 3, and the thickness is desired to be, for example, about 0.5 to 3 μm within a range not exceeding the thickness of the epitaxial layer 2. The impurity concentration of N in this process is desired to be higher than the n-type impurity concentration of the epitaxial layer 2 and is desired to be equal to or higher than $1\times10^{17}$ cm$^{-3}$. The depletion restraining layer may be formed by n-type epitaxial growth. The impurity concentration and thickness of the depletion restraining layer in that case is caused to be equivalent to those in the case in which it is formed by ion implantation.

Figure 11:
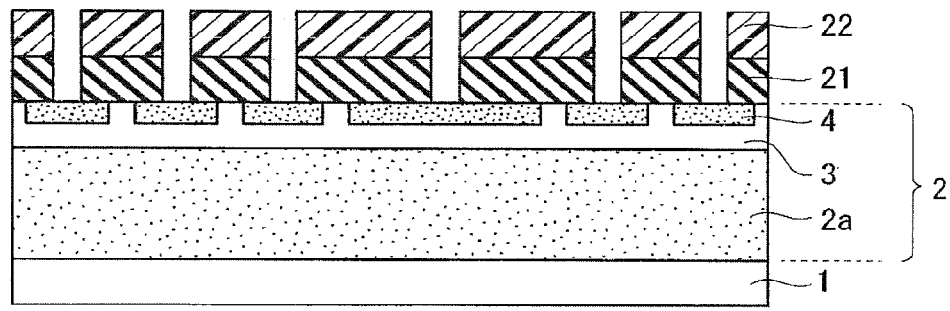
FIG. 11 is a cross-sectional view showing the manufacturing method of the MOSFET according to the first embodiment.

Subsequently, as shown in FIG. 11, a silicon oxide film 21 deposited on the surface of the epitaxial layer 2 by about 1 to 2 μm, and an etching mask 22 composed of a resist material is formed thereon. The etching mask 22 is formed in a pattern in which the formation regions of the trenches 5 in the source regions 4 are opened by photolithography techniques. Since the trenches 5 have an approximately grid-like pattern in the planar view, the pattern of the etching mask 22 includes a matrix-like pattern in which that pattern is inverted.

Then, the silicon oxide film 21 is patterned by reactive ion etching (ME) treatment using the etching mask 22 as a mask. In other words, the pattern of the etching mask 22 is transferred to the silicon oxide film 21. As a result, the structure shown in FIG. 11 is obtained. The patterned silicon oxide film 21 serves as an etching mask of a next process.

Figure 12:
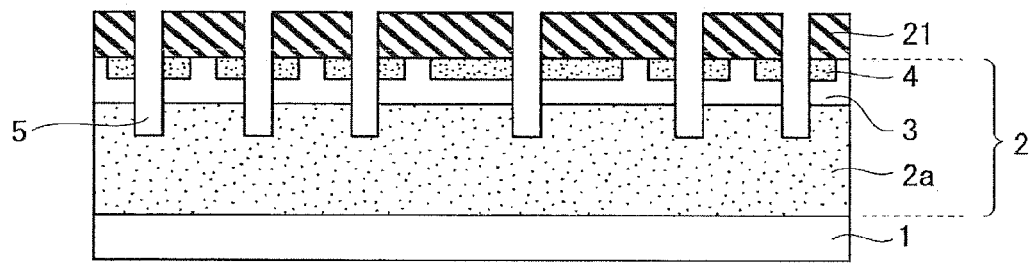
FIG. 12 is a cross-sectional view showing the manufacturing method of the MOSFET according to the first embodiment.

Then, as shown in FIG. 12, the trenches 5, which penetrate the source region 4 and the base region 3 and reach the drift layer 2a, are formed by RIE treatment using the patterned silicon oxide film 21 as a mask. The depth of the trench 5 is equal to or more than the depth of the base region 3 and is, for example, about 1.0 to 6.0 μm.

Figure 13:
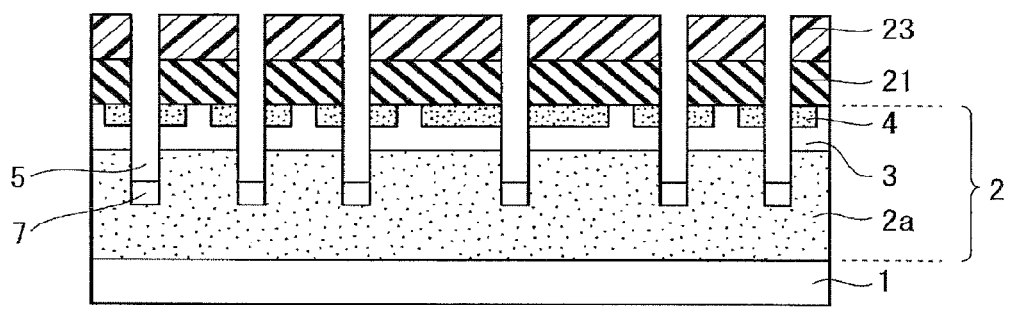
FIG. 13 is a cross-sectional view showing the manufacturing method of the MOSFET according to the first embodiment.

Then, as shown in FIG. 13, the p-type protective diffusion layer 7 is formed in the bottom portions of the trenches 5 by forming an implantation mask 23, which has a pattern exposing the trenches 5 (pattern similar to the etching mask 22), and carrying out ion implantation using that as a mask. Al is used as a p-type impurity of the protective diffusion layer 7. The impurity concentration of Al implanted in this process is desired to be, for example, within a range of $1\times10^{17}$ cm$^{-3}$ to $1\times10^{19}$ cm$^{-3}$.

Instead of the implantation mask 23, the (patterned) silicon oxide film 21, which is the etching mask when the trenches 5 are formed, may be used. By virtue of this, manufacturing processes can be simplified, and cost thereof can be reduced. If the silicon oxide film 21 is to be used instead of the implantation mask 23, the thickness and etching conditions of the silicon oxide film 21 have to be adjusted so that the silicon oxide film 21 having a certain degree of thickness remains after the trenches 5 are formed.

After the protective diffusion layer 7 is formed in the above described manner, the implantation mask 23 is removed. Then, annealing for activating the impurity ion-implanted in the above described process is carried out by using a thermal treatment apparatus. This annealing is carried out, for example, under treatment conditions of 1,300 to 1,900° C. for 30 seconds to one hour in an atmosphere of an inert gas such as argon (Ar) gas or in vacuum.

Figure 14:
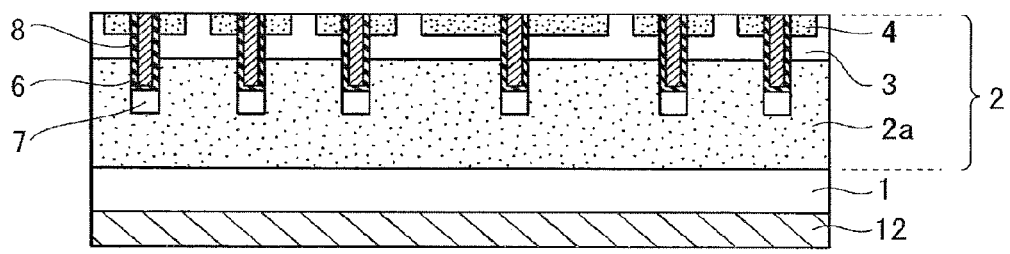
FIG. 14 is a cross-sectional view showing the manufacturing method of the MOSFET according to the first embodiment.

Then, after a silicon oxide film is formed on the entire surface (including the inner surfaces of the trenches 5) of the epitaxial layer 2, polysilicon is deposited by a low-pressure CVD method so as to bury the trenches 5. Then, as shown in FIG. 14, the gate insulating film 6 and the gate electrodes 8 are formed in the trenches 5 by patterning or etching-back them. The silicon oxide film which serves as the gate insulating film 6 may be formed by thermally oxidizing the surface of the epitaxial layer 2 or may be formed by deposition on the epitaxial layer 2.

Subsequently, the interlayer insulating film 9, which covers the gate electrodes 8, is formed on the entire surface of the epitaxial layer 2 by the low-pressure CVD method. Then, as shown in FIG. 15, the contact holes, which reach the source regions 4 and the base region 3, are formed by patterning the interlayer insulating film 9.

Figure 15:
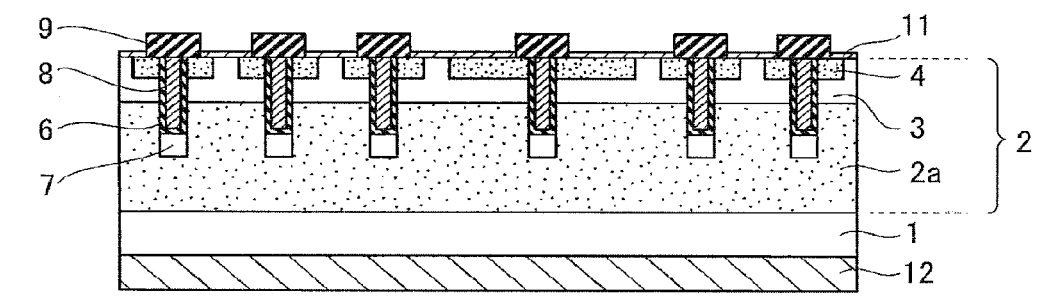
FIG. 15 is a cross-sectional view showing the manufacturing method of the MOSFET according to the first embodiment.

Subsequently, as shown in FIG. 15, the ohmic electrodes 11 are formed on the epitaxial layer 2 (the source regions 4 and the base region 3) exposed from the bottoms of the contact holes. As a formation method of the ohmic electrodes 11, for example, a metal film containing nickel (Ni) as a main component is formed on the entire surface of the epitaxial layer 2 exposed from the bottoms of the contact holes and is reacted with silicon carbide by thermal treatment at 600 to 1,100° C. to form a silicide film which serves as the ohmic electrodes 11. Then, the unreacted metal film remaining on the interlayer insulating film 9 is removed by wet etching using, for example, nitric acid, sulfuric acid, or hydrochloric acid or a liquid mixture thereof with hydrogen peroxide water. After the metal film remaining on the interlayer insulating film 9 is removed, thermal treatment may be carried out again. In this case, if it is carried out at a temperature higher than that of the previous thermal treatment, ohmic contacts with further lower contact resistances are formed.

Figure 16:
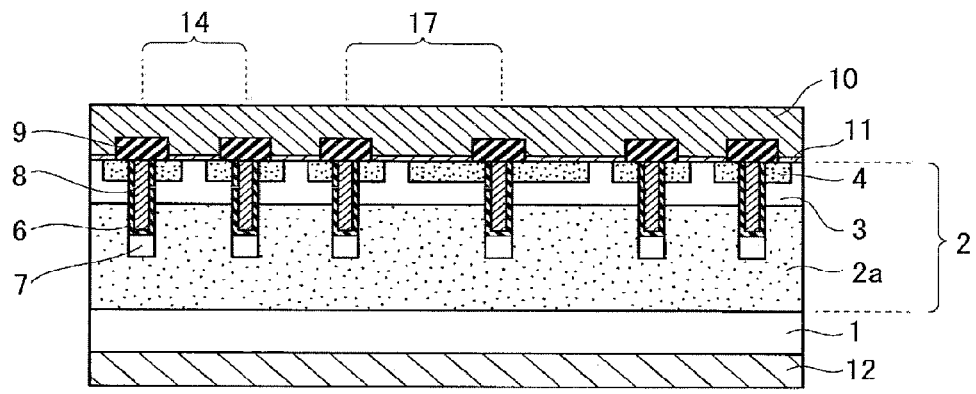
FIG. 16 is a cross-sectional view showing the manufacturing method of the MOSFET according to the first embodiment.

Then, as shown in FIG. 16, the source electrode 10 is formed on the interlayer insulating film 9 and in the contact holes by depositing an electrode material such as an Al alloy on the structure obtained in FIG. 15. In the end, the drain electrode 12 is formed by depositing an electrode material such as an Al alloy on a lower surface of the SiC substrate 1. As a result of these, the structure shown in FIG. 5, in other words, the MOSFET according to the present first embodiment is obtained.

<Effects>

In the MOSFET according to the present first embodiment configured in above described manner, in the contour shape of the corner cell 17 in the planar view, the longest distance among distances each of which is shortest distance between the longest side and each of the sides opposite to the longest side is configured to be equal to or less than two times of the length of one of the equal sides or the short side of the inner cell 14. By virtue of this, the depletion-layer thickness equivalent to that of the internal cell 14 can be obtained also in the corner cell 17, and, therefore, avalanche breakdown can be restrained.

In the present first embodiment, the polygonal shape of the corner cell 17 have more vertices than the vertices of the polygonal shape of the internal cell 14. By virtue of this, the layout of the corner cell 17 can be designed more easily than that of the internal cell 14.

In the present first embodiment, all of the interior angles of the polygonal shape of the corner cell 17 are equal to or more than 90°. By virtue of this, the avalanche breakdown at the corner cell 17 due to the concentration of electric fields can be restrained, and, therefore, the withstand voltage can be improved.

In the present first embodiment, the corner cell 17 is provided with the source region 4 and with the source electrode 10 and independently has the function of a MOSFET. By virtue of this, in contrast to the techniques described in Patent Documents 1 and 2 of forming the structures dedicated for diminishing electric fields in the outer peripheral portion, in other words, the techniques not having the function of a MOSFET in the outer peripheral portion, the withstand voltage can be increased without increasing the on-resistance.

In the present first embodiment, the epitaxial layer (semiconductor layer) 2 includes a wide-band-gap semiconductor such as SiC. By virtue of this, a high withstand voltage and a low loss of the MOSFET can be realized. The wide band gap is not limited to SiC, but may be, for example, a GaN-based material, diamond, etc.

Modification Examples

In the above description, the MOSFET having the structure in which the drift layer 2*a* and the SiC substrate 1, which is a buffer layer, have the same conductivity type has been described. However, this can be applied also to an IGBT having the structure in which the drift layer 2*a* and the SiC substrate 1 have mutually different conductivity types. For example, in the configuration shown in FIG. 4 and FIG. 5, the n conductivity type of the SiC substrate 1 is changed to a p conductivity type, the configuration of the IGBT is obtained. In the configuration like this, the source region 4 and the source electrode 10 of the MOSFET correspond to an emitter region and an emitter electrode of the IGBT, respectively, and the drain electrode 12 of the MOSFET corresponds to a collector electrode.

Figure 17:
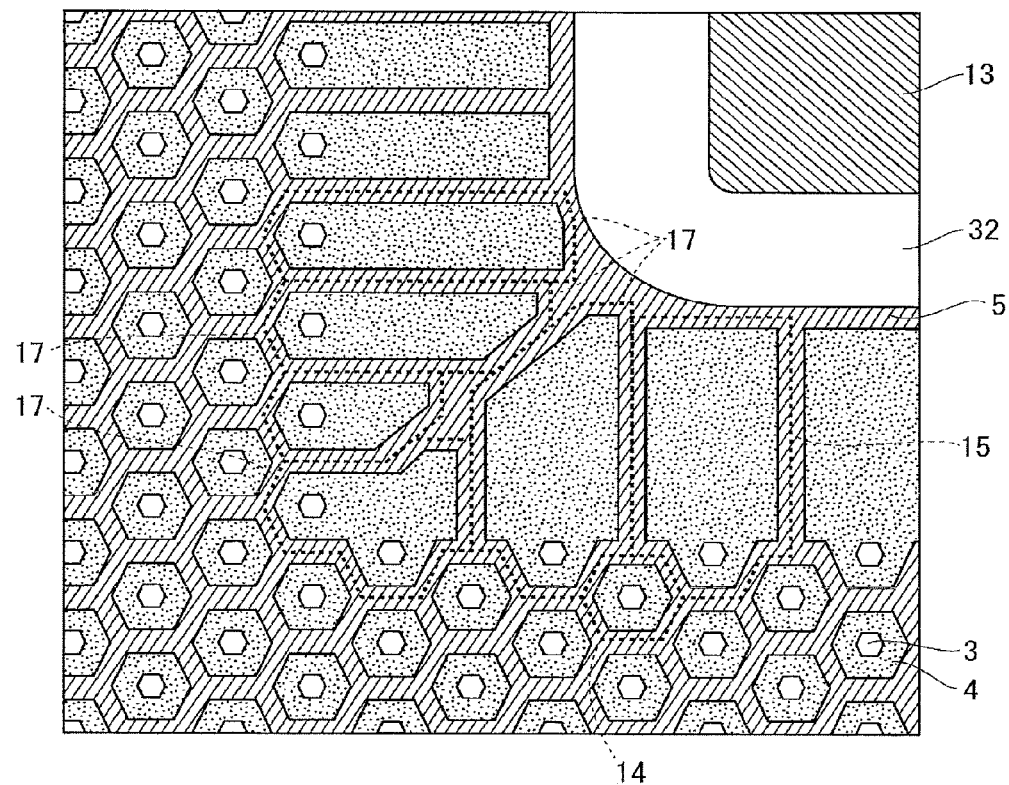
FIG. 17 is a plan view showing a configuration of a MOSFET according to a modification example of the first embodiment.

In the present first embodiment, the gate electrodes 8 (the contour shapes of the cells) have an approximately grid-like pattern, but are not limited thereto. The gate electrodes 8 (the contour shapes of the cells), for example, may have a pattern of approximately hexagonal shapes as shown in FIG. 17, may have a pattern of approximately stripe shapes as shown in FIG. 18, or may be other patterns. Any of the patterns of the gate electrodes 8 (the contour shape of the cells) enables obtainment of effects similar to those described above.

In the first embodiment, the semiconductor device composed of SiC, which is one of wide-band-gap semiconductors, has been described. However, no limitation is imposed by this, the present invention can be applied also to semiconductor devices composed of other wide-band-gap semiconductors such as gallium-nitride (GaN)-based materials, diamonds, etc.

Second Embodiment

<Configuration>

Figure 19:
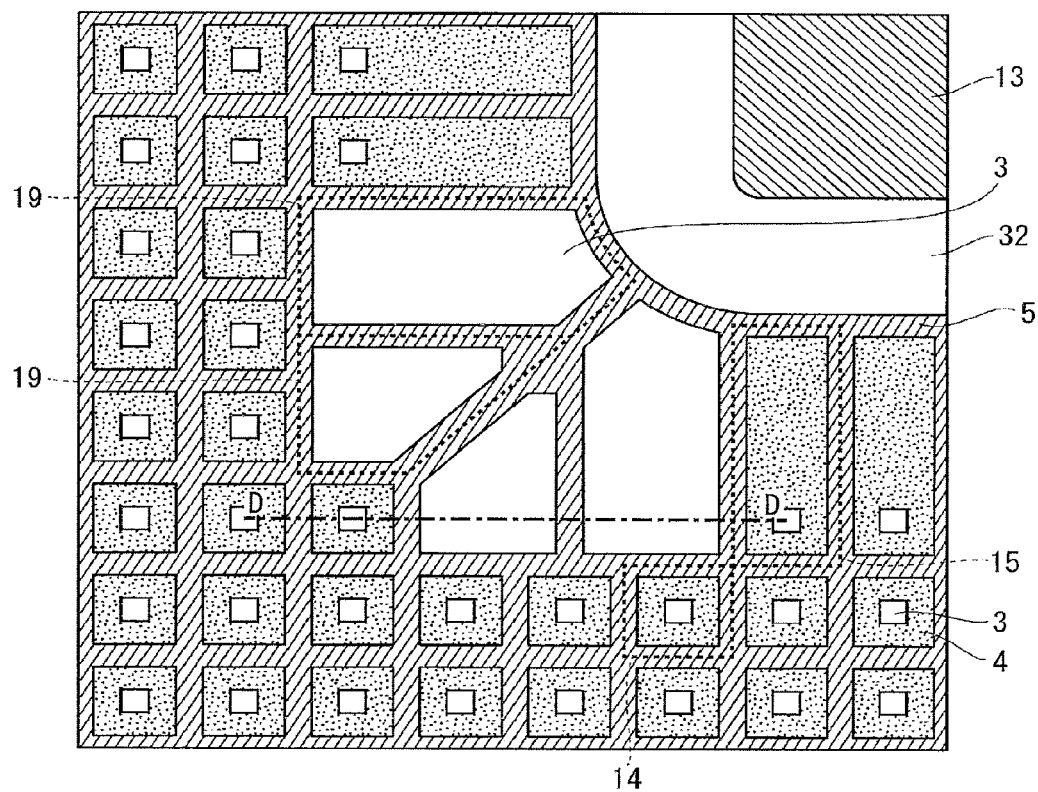
FIG. 19 is a plan view showing a configuration of a MOSFET according to a second embodiment.
Figure 20:
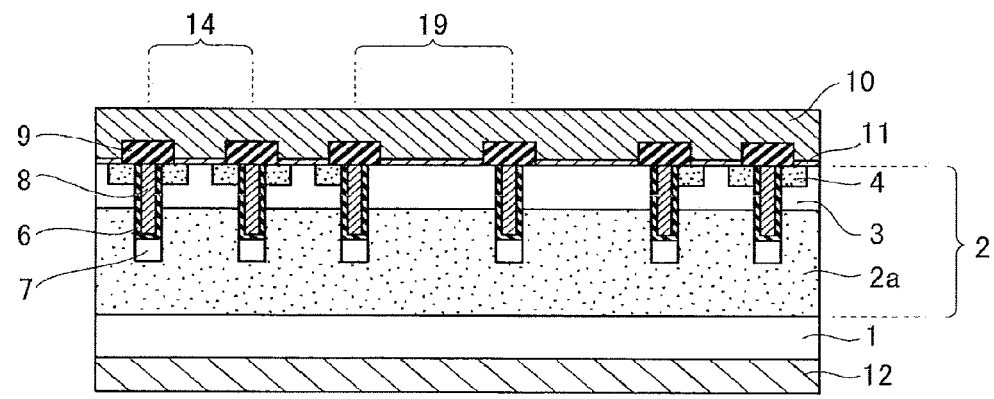
FIG. 20 is a cross-sectional view showing the configuration of the MOSFET according to the second embodiment.

FIG. 19 is a plan view showing part of a configuration of a MOSFET according to a second embodiment of the present invention as well as FIG. 2. FIG. 20 is a cross-sectional view showing part of the configuration of the MOSFET according to the present second embodiment, is specifically a cross-sectional view along line D-D of FIG. 19, and is showing a cross-sectional configuration of the internal cells 14 and the corner cells 17. Hereinafter, in the MOSFET according to the present second embodiment, the constituent elements same as or similar to the constituent elements described above are denoted by the same reference signs, and different parts will be mainly described.

The MOSFET according to the second embodiment is different in a point that corner cells 19 are provided instead of the corner cells 17 described in the first embodiment. As shown in FIG. 5, the corner cells 17 according to the first embodiment are provided with the source regions 4. However, as shown in FIG. 20, the corner cells 19 according to the present second embodiment are configured not to be provided with the source regions 4.

<Effects>

With reference to FIG. 5 and FIG. 20, effects of the corner cells 19 according to the present second embodiment will be described. In the inner corner portion in which the corner cells 17, 19 are disposed, extension of depletion layers is different since the state of electric fields is in a state different from that of the interior of the cell region 31 or in other outer peripheral portions. Along with this, in the corner cell 17 of the first embodiment provided with the source region 4, there are some possibilities that a depletion layer extending from the source region 4 of an upper portion in the base region 3 and a depletion layer extending from the drift layer 2*a* in a lower portion contact each other and that the insulation between the drift layer 2*a* and the source region 4 is broken and causes a punch-through phenomenon in which carriers flow.

On the other hand, since the corner cells 19 according to the present second embodiment are not provided with the source regions 4, the punch-through phenomenon can be restrained.

In order to restrain the punch-through phenomenon in the corner cells 19, a method of increasing the impurity concentration of the base region 3 and reducing the depletion layers extending in the base region 3 can be also employed. However, in that case, the number of patterning and ion implantation is increased. On the other hand, according to the present second embodiment, since the corner cells 19 are not provided with the source regions 4, as a manufacturing method thereof, in the process of FIG. 10 of the first embodiment, it is only required to change the pattern of the corner cells 19 among the patterns for forming the source regions 4. Therefore, the MOSFET can be formed by the same man-hours as the first embodiment.

On the other hand, since the corner cells 19 according to the present second embodiment do not independently have the function of MOSFETs, the on-resistance of the MOSFET is increased by the amount of the area of the corner cells 19 occupied in the whole cell region 31 compared with the on-resistance of the first embodiment, but this is small so that it can be ignored compared with variations in MOSFET manufacturing. On the other hand, in the techniques described in Patent Documents 1 and 2, since all of the cells in the outer peripheral portion of the cell region 31 lose the function of MOSFETs, on-resistance is considerably large compared with the increase of the on-resistance of the MOSFET according to the present second embodiment.

In summary of the above description, according to the present second embodiment, the corner cells 19 are configured so as not to be provided with the source regions 4. By virtue of this, on-resistance may be increased by an approximately ignorable degree; however, occurrence of the punch-through phenomenon can be restrained, and a high withstand voltage can be realized.

In the present second embodiment, in the contour shape of the corner cell 19 in the planar view, the longest distance among distances each of which is shortest distance between the longest side and each of the sides opposite to the longest side is not required to be equal to or less than two times of the length of the short side of the internal cell 14.

Third Embodiment

<Configuration>

Figure 21:
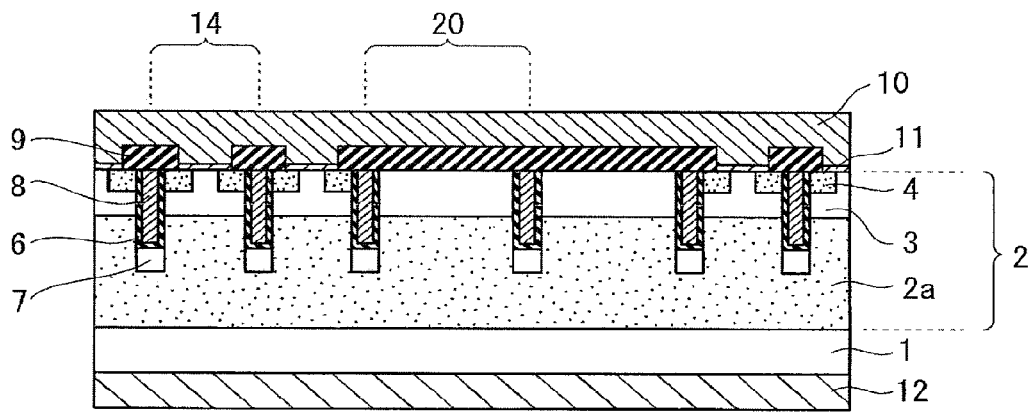
FIG. 21 is a cross-sectional view showing a configuration of a MOSFET according to a third embodiment.

FIG. 21 is a cross-sectional view showing part of a configuration of a MOSFET according to a present third embodiment as well as FIG. 20. Hereinafter, in the MOSFET according to the present third embodiment, the constituent elements same as or similar to the constituent elements described above are denoted by the same reference signs, and different parts will be mainly described.

The MOSFET according to the present third embodiment is different in a point that the MOSFET according to the present third embodiment is provided with corner cells 20 instead of the corner cells 17 described in the first embodiment. As shown in FIG. 5, in the first embodiment, in the corner cell 17, the source electrode 10 is electrically connected to the source regions 4 and the base region 3. However, as shown in FIG. 21, in the present third embodiment, in the corner cells 20, the source electrode 10 is electrically insulated from the source regions 4 and the base region 3. As shown in FIG. 21, the corner cells 20 according to the present third embodiment may be configured not to be provided with the source regions 4 as well as the second embodiment.

<Effects>

With reference to FIG. 21, effects of the corner cell 20 according to the present third embodiment will be described. The paths through which avalanche currents flow to various cells such as the corner cell 20 are between the drain electrode 12 and the source electrode 10. Therefore, according to the present third embodiment in which the source electrode 10 is electrically insulated from the source region 4 and the base region 3 in the corner cell 20 having a low withstand voltage, the overall withstand voltage can be improved. As a manufacturing method of the MOSFET according to the present third embodiment, it is only required not to remove the interlayer insulating film 9 in the corner cell 20 in the process of FIG. 15 of the first embodiment, and this can be easily realized. The corner cell 20 according to the present third embodiment does not independently have the function of a MOSFET, but the increase of the on-resistance caused along with that is a practically approximately ignorable degree as well as the second embodiment.

In summary of the above description, according to the present third embodiment, in the corner cell 20, the source electrode 10 is configured to be electrically insulated from the source region 4 and the base region 3. By virtue of this, on-resistance may be increased by an approximately ignorable degree; however, occurrence of the punch-through phenomenon can be restrained, and a high withstand voltage can be realized.

In the present third embodiment, in the contour shape of the corner cell 20 in the planar view, the longest distance among distances each of which is shortest distance between the longest side and each of the sides opposite to the longest side is not required to be equal to or less than two times of the length of the short side of the internal cell 14.

In the present invention, the embodiments and the modification examples can be freely combined, and the embodiments and the modification examples can be arbitrarily changed or omitted within the scope of the present invention.

Fourth Embodiment

<Configuration>

Figure 22:
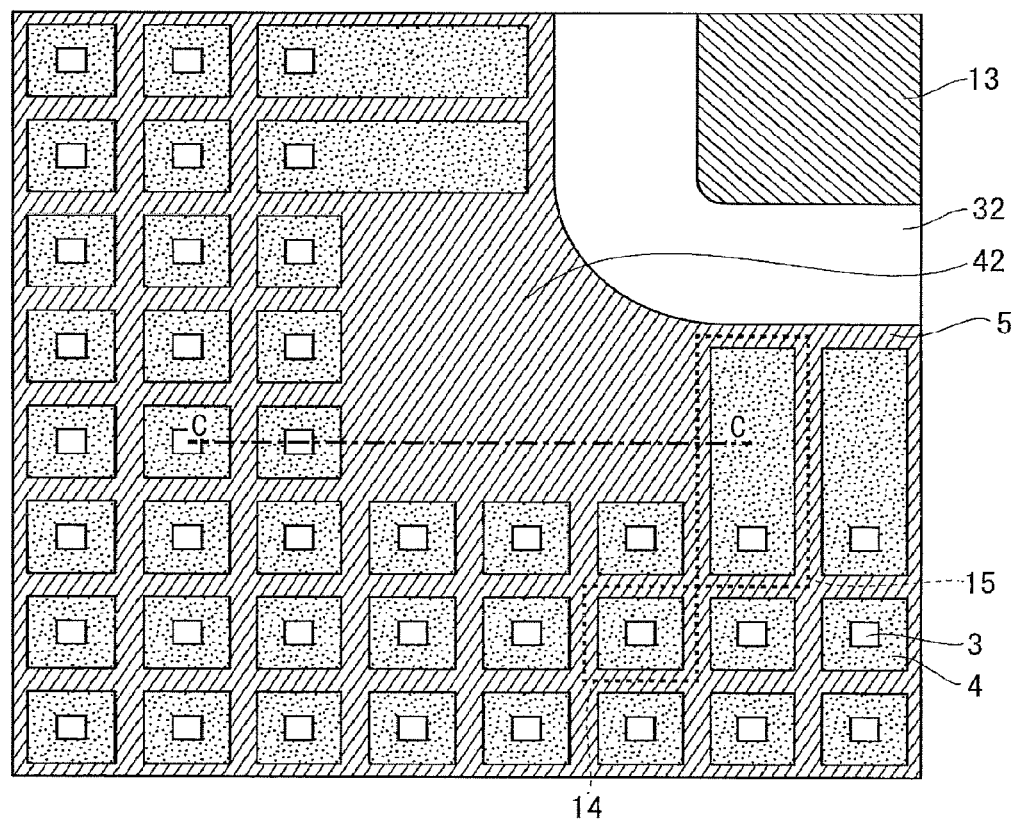
FIG. 22 is a plan view showing a configuration of a MOSFET according to a fourth embodiment.
Figure 23:
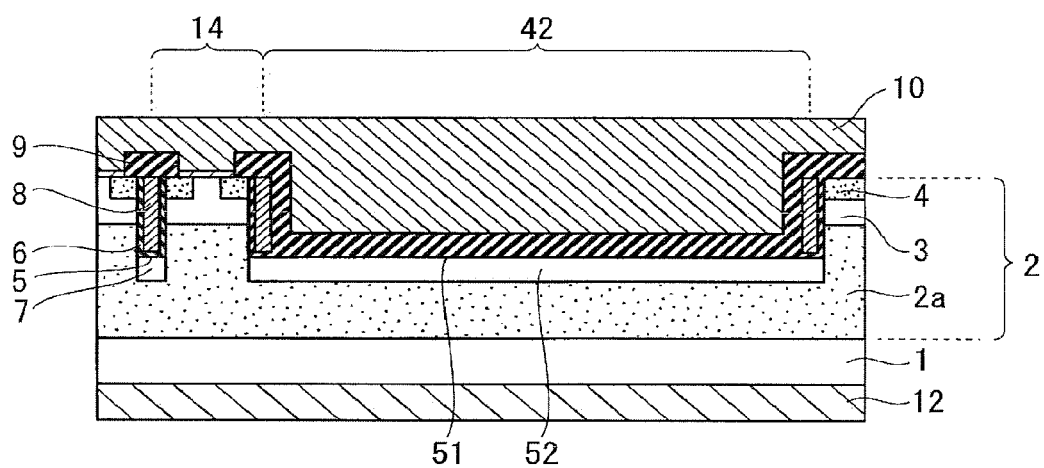
FIG. 23 is a cross-sectional view showing the configuration of the MOSFET according to the fourth embodiment.

FIG. 22 is a plan view showing part of a configuration of a MOSFET according to a fourth embodiment of the present invention as well as FIG. 2. FIG. 23 is a cross-sectional view showing part of the configuration of the MOSFET according to the present fourth embodiment as well as FIG. 20 and is specifically a cross-sectional view along line C-C of FIG. 22. Hereinafter, in the MOSFET according to the present fourth embodiment, the constituent elements same as or similar to the constituent elements described above are denoted by the same reference signs, and different parts will be mainly described.

The MOSFET according to the present fourth embodiment is different in a point that an invalid region 42 in which cells (the internal cells 14, the outer-peripheral-portion cells 15, the corner cells 17) are not present is provided instead of the corner cells 17 described in the first embodiment. More specifically, as shown in FIG. 4, in the first embodiment, the corner cells 17 are disposed in the region 41 opposite to the gate pad 13. However, as shown in FIG. 22, in the present fourth embodiment, the invalid region 42 is disposed in the region 41.

As shown in FIG. 23, in the invalid region 42, a trench 51 which is a second trench penetrating the base region 3 of the internal cells 14, etc. and reaching the epitaxial layer 2 below the base region 3 is disposed. This trench 51 is wider than the trench 5 which is a first trench.

The invalid region 42 is provided with an n-type protective diffusion layer 52, which is a second protective diffusion layer. The protective diffusion layer 52 is formed on a bottom portion of the trench 51 as well as the protective diffusion layer 7, which is a first protective diffusion layer.

<Effects>

Effects of the invalid region 42 according to the present fourth embodiment will be described with reference to FIG. 21. The rate by which the cell region 31 is occupied by the region 41 (FIG. 3), in which the corner cells 17, etc. are disposed, is a practically ignorable degree. However, as described before, it is difficult to dispose normal cells in the region 41 since avalanche breakdown easily occurs therein. Therefore, the whole region 41 is formed into the trench 51, and the protective diffusion layer 52 is provided in the bottom portion thereof; as a result, reduction of the withstand voltage in the region 41 can be prevented, and the withstand voltage as a whole can be improved.

As a manufacturing method of the MOSFET according to the present fourth embodiment, in the process of FIG. 11 of the first embodiment, it is only required to remove the etching mask 22 above the region 41 and remove the silicon oxide film 21 by RIE. By virtue of this, when RIE is carried out by using the silicon oxide film 21 as a mask in FIG. 12, the trench 51 is disposed in all of the region 41, and the protective diffusion layer 52 is formed on all of the bottom portion of the trench 51, which is corresponding to the region 41, by ion implantation thereafter. As a result, the invalid region 42 can be formed.

The invalid region 42 according to the present fourth embodiment does not independently has the function of a MOSFET. However, the increase of the on-resistance caused along with that is a practically approximately ignorable degree as well as the second and third embodiments.

In summary of the above description, according to the present fourth embodiment, the invalid region 42 provided with the protective diffusion layer 52 formed in the bottom portion of the trench 51 is disposed in the region 41 opposite to the gate pad 13. By virtue of this, on-resistance may be increased by an approximately ignorable degree; however, a high withstand voltage can be realized.

The present invention has been described in detail. However, the above described description are examples in all aspects, and the present invention is not limited thereto. It is construed that numerous modification examples, which are not shown as examples, can be expected without deviating from the scope of the present invention.

REFERENCE SIGNS LIST

2: epitaxial layer
3: base region
4: source region
5, 51: trench
6: gate insulating film
7, 52: protective diffusion layer
8: gate electrode
10: source electrode
13: gate pad
14: internal cell
17, 19, 20: corner cell
41: region
42: invalid region

The invention claimed is:

1. A semiconductor device comprising:
a gate pad;
a first cell disposed in a region opposite to a corner portion of said gate pad in a planar view; and
a second cell disposed in a region in an opposite side of said gate pad with respect to said first cell in the planar view; wherein
each of said first and second cells is provided with:
a semiconductor layer of a first conductivity type;
a base region of a second conductivity type formed in an upper portion of said semiconductor layer;
a gate electrode disposed via a gate insulating film in a trench penetrating said base region and reaching said semiconductor layer below said base region, said gate electrode having a pattern corresponding to a contour shape of said first and second cell in the planar view, and said gate electrode electrically connected to said gate pad; and
a protective diffusion layer of said second conductivity type formed in a bottom portion of said trench;
at least said second cell among said first and second cells is further provided with:
a source region of said first conductivity type formed in a part adjacent to said gate insulating film in an upper portion of said base region and
a source electrode electrically connected to said base region and said source region;
said contour shape of each of said first and second cells is a polygonal shape of a four-or-more sided polygon;
in said contour shape of said first cell, a longest distance among distances each of which is shortest distance between a longest side and each of sides opposite to said longest side is equal to or less than two times of a length of one of equal sides or a short side of said second cell; and
said polygonal shape of said first cell has more vertices than vertices of said polygonal shape of said second cell.

2. The semiconductor device according to claim 1, wherein
all of interior angles of said polygonal shape of said first cell are 90° or more.

3. The semiconductor device according to claim 1, wherein
said first cell is not provided with said source region.

4. The semiconductor device according to claim 1, wherein
in said first cell, said source electrode is electrically insulated from said base region and said source region.

5. The semiconductor device according to claim 1, wherein
said first cell is further provided with said source region and with said gate electrode and independently has a function of a switching element.

6. A semiconductor device comprising:
a gate pad;
a first cell disposed in a region opposite to a corner portion of said gate pad in a planar view;
a second cell disposed in a region in an opposite side of said gate pad with respect to said first cell in the planar view; and
a third cell disposed in a region opposite to a side portion of said gate pad in the planar view, said third cell having a side larger than a side of said second cell as a longest side; wherein each of said first, second, and third cells is provided with:
a semiconductor layer of a first conductivity type;
a base region of a second conductivity type formed in an upper portion of said semiconductor layer;
a gate electrode disposed via a gate insulating film in a trench penetrating said base region and reaching said semiconductor layer below said base region, said gate electrode having a pattern corresponding to a contour shape of said first, second, and third cell in the planar view, and said gate electrode electrically connected to said gate pad; and
a protective diffusion layer of said second conductivity type formed in a bottom portion of said trench;
at least said second cell among said first, second, and third cells is further provided with:
a source region of said first conductivity type formed in a part adjacent to said gate insulating film in an upper portion of said base region and
a source electrode electrically connected to said base region and said source region;
said contour shape of each of said first, second, and third cells is a polygonal shape of a four-or-more sided polygon;
in said contour shape of said first cell, a longest distance among distances each of which is shortest distance between a longest side and each of sides opposite to said longest side is equal to or less than two times of a length of one of equal sides or a short side of said second cell; and
said polygonal shape of said first cell has more vertices than vertices of said polygonal shape of said second cell.

7. A semiconductor device comprising:
a gate pad;
a cell; and
an invalid region having none of said cell and serving as a region opposite to a corner portion of said gate pad in a planar view; wherein
said cells are provided with:
a semiconductor layer of a first conductivity type;
a base region of a second conductivity type formed in an upper portion of said semiconductor layer;
a gate electrode disposed via a gate insulating film in a first trench penetrating said base region and reaching said semiconductor layer below said base region, said gate electrode having a pattern corresponding to a contour shape of said cells in the planar view, and said gate electrode electrically connected to said gate pad;
a first protective diffusion layer of said second conductivity type formed in a bottom portion of said first trench;
a source region of said first conductivity type formed in a part adjacent to said gate insulating film in an upper portion of said base region; and
a source electrode electrically connected to said base region and said source region;
said invalid region is provided with a second protective diffusion layer of said second conductivity type formed in a bottom portion of a second trench penetrating said base region and reaching said semiconductor layer below said base region;
said second trench is wider than said first trench; and
a polygonal shape of a first cell among said cells has more vertices than vertices of a polygonal shape of a second cell among said cells.

8. The semiconductor device according to claim 1, wherein
said semiconductor layer includes a wide-band-gap semiconductor.

9. The semiconductor device according to claim 1, wherein
said corner portion of said gate pad includes a curved portion.

10. The semiconductor device according to claim 1, wherein
said first cell has a larger area than said second cell.

11. The semiconductor device according to claim 6, wherein
all of interior angles of said polygonal shape of said first cell are 90° or more.

12. The semiconductor device according to claim 6, wherein
said first cell is not provided with said source region.

13. The semiconductor device according to claim 6, wherein
in said first cell, said source electrode is electrically insulated from said base region and said source region.

14. The semiconductor device according to claim 6, wherein
said first cell is further provided with said source region and with said gate electrode and independently has a function of a switching element.

15. The semiconductor device according to claim 6, wherein
said semiconductor layer includes a wide-band-gap semiconductor.

16. The semiconductor device according to claim 6, wherein
said corner portion of said gate pad includes a curved portion.

17. The semiconductor device according to claim 7, wherein
said semiconductor layer includes a wide-band-gap semiconductor.

18. The semiconductor device according to claim 7, wherein
said corner portion of said gate pad includes a curved portion.

* * * * *